United States Patent
Taniguchi et al.

(10) Patent No.: US 6,734,557 B2
(45) Date of Patent: May 11, 2004

(54) SEMICONDUCTOR DEVICE

(75) Inventors: Kiyomi Taniguchi, Ikoma-gun (JP); Hisashige Nishida, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/369,760

(22) Filed: Feb. 21, 2003

(65) Prior Publication Data
US 2003/0173666 A1 Sep. 18, 2003

(30) Foreign Application Priority Data
Mar. 12, 2002  (JP) ........................................ 2002-067303

(51) Int. Cl.[7] ............................................... H01L 23/48
(52) U.S. Cl. .................... 257/738; 257/738; 257/737
(58) Field of Search ................................ 257/738, 687, 257/774, 775, 686, 701, 779, 780

(56) References Cited
U.S. PATENT DOCUMENTS 6,396,707 B1 * 5/2002 Huang et al. ................ 361/760
6,534,391 B1 * 3/2003 Huemoeller et al. ........ 438/612
6,542,377 B1 * 4/2003 Fisher et al. ................ 361/777

FOREIGN PATENT DOCUMENTS
JP  08-083865  3/1996
JP  9-232736  9/1997

* cited by examiner

Primary Examiner—David Nelms
Assistant Examiner—Thinh T Nguyen
(74) Attorney, Agent, or Firm—Nixon & Vanderhye P.C.

(57) ABSTRACT

A semiconductor device comprising: a substrate; first and second interconnection patterns respectively provided on upper and lower surfaces of the substrate; a through-hole electrode extending through the substrate for electrically connecting the first and second interconnection patterns; a semiconductor chip provided on the upper surface of the substrate and electrically connected to the first interconnection pattern; and a resist film covering the second interconnection pattern; the second interconnection pattern comprising a generally round land and a lead interconnection portion extending from the land, the resist film having an opening formed therein for exposing the entire land, the opening having a curved edge surrounding a peripheral edge of the land and a linear edge linearly extending along a boundary between the land and the lead interconnection portion, the exposed land having a solder ball as an external terminal thereon.

14 Claims, 4 Drawing Sheets

SEMICONDUCTOR DEVICE

CROSS-REFERENCE TO RELATED APPLICATIONS

This application is related to Japanese application No. 2002-067303 filed on Mar. 12, 2002, whose priority is claimed under 35 USC §119, the disclosure of which is incorporated by reference in its entirety.

BACKGROUND OF THE INVENTION

1. Field of the Invention

The present invention relates to a semiconductor device and, more specifically, to a semiconductor device package having solder balls as external connection terminals.

2. Description of the Related Art

For higher density integration of semiconductor devices on a mount board (mother board), the sizes of the respective semiconductor devices are reduced. Currently, a semiconductor device of BGA (ball grid array) type is known as having a reduced size. The BGA-type semiconductor device includes external terminals in the form of solder balls arranged in an area array on a bottom of a package for reduction of a mount area on the mount board.

Further, a semiconductor device of FBGA type having external terminals arranged at smaller pitches than the BGA-type semiconductor device is also known, which is implemented as a semiconductor device of CSP (chip size package) type.

An exemplary conventional CSP-type semiconductor device will be described with reference to FIGS. 5 to 7. FIG. 5 is a schematic sectional view illustrating the CSP-type semiconductor device. FIG. 6 is an enlarged diagram illustrating major portions of the semiconductor device of FIG. 5, and FIG. 7 is a bottom view of the semiconductor device of FIG. 6. In FIG. 7, no solder ball is illustrated for simplicity.

As shown in FIG. 5, the exemplary conventional CSP-type semiconductor device 101 includes a semiconductor chip 105 mounted on a upper surface of a substrate 102. Connection terminals (not shown) of the semiconductor chip 105 are connected to an interconnection pattern 103 provided on the upper surface of the substrate 102, for example, by bonding wires 109. The connection may be achieved by a flip chip method. The semiconductor chip 105 and the bonding wires 109 are sealed in a mold resin. The substrate 102 further has an interconnection pattern 104 provided on a lower surface thereof. The interconnection pattern 104 on the lower surface is electrically connected to the interconnection pattern 103 provided on the upper surface via through-hole electrodes 106.

The interconnection pattern 104 on the lower surface includes generally round lands 104a and interconnection portions 104b respectively extending from the lands 104a. As best shown in FIGS. 6 and 7, a resist film (solder resist film) 107 is provided on the interconnection pattern 104 on the lower surface. The resist film 107 has generally round openings 107a through which the lands 104a are exposed. Solder balls 108 are respectively bonded onto the exposed lands 104a.

In generally, the bonding strength between the lands and the solder balls is important for the CSP-type semiconductor device. It is also important to prevent deformation and displacement of the solder balls which may be caused by fused solder spreading over the interconnection portions when the solder balls are bonded onto the lands. To this end, a consideration is given to the size of the openings formed in the resist film and the shape of the lands.

For example, there is known a semiconductor device in which lands inclusive of their side surfaces are completely exposed through greater size openings formed in a resist film and solder balls are bonded onto the lands as covering not only the top surfaces but also the side surfaces of the lands (see, for example, Japanese Unexamined Patent Publication No. 8-83865 (1996)). Since the solder balls cover the top and side surfaces of the lands in the semiconductor device, the bonding strength between the solder balls and the lands is improved.

There is also known a semiconductor device in which a resist film covers longitudinal end portions of oval lands (see, for example, Japanese Unexamined Patent Publication No. 9-232736 (1997)). This semiconductor device ensures a sufficient bonding strength between solder balls and the lands, while preventing the displacement of the solder balls.

As described above, the conventional semiconductor device in which the solder balls cover the top and side surfaces of the lands ensures an improved bonding strength between the solder balls and the lands. In this semiconductor device, however, not only the lands but also the interconnection portions extending from the lands are exposed from the resist film. More specifically, lead portions of the interconnection portions adjacent to the lands are exposed from the resist film. Therefore, fused solder is liable to spread over the lead portions of the interconnection portions when the solder balls are bonded onto the lands. This makes it difficult to form the solder balls into spherical shape. Further, there is a possibility that the solder balls have variations in diameter or are displaced.

In general, the lead portions of the interconnection portions adjacent to the lands each have a width progressively decreasing toward the interconnection portions apart from the lands for prevention of concentration of stresses on the interconnection portions. However, the openings formed in the resist film are greater in size than the lands in the semiconductor device, so that edges of the openings of the resist film are liable to cross the lead portions each having a progressively decreasing width. When the semiconductor device with the edges of the resist film crossing the lead portions is subjected to a post thermal cycle test, stresses caused due to a difference in linear expansion between the resist film and the interconnection portions are liable to concentrate on the lead portions. Particularly, the thinner lead portions crossed by the edges of the resist film are more liable to be broken.

On the other hand, the conventional semiconductor device in which the longitudinal edges of the oval lands are covered with the resist film also ensures a sufficient bonding strength between the solder balls and the lands, while preventing the displacement of the solder balls. However, the flexibility in designing the interconnection pattern is reduced, because the lands are oval.

SUMMARY OF THE INVENTION

In view of the foregoing, the present invention is directed to a semiconductor device which ensures a sufficient bonding strength between solder balls and lands, prevents the displacement of the solder balls, and allows for flexible design of an interconnection pattern.

According to the present invention, there is provided a semiconductor device, which comprises: a substrate; first and second interconnection patterns respectively provided on upper and lower surfaces of the substrate; a through-hole electrode extending through the substrate for electrically connecting the first and second interconnection patterns; a semiconductor chip provided on the upper surface of the substrate and electrically connected to the first interconnection pattern; and a resist film covering the second interconnection pattern; the second interconnection pattern comprising a generally round land and a lead interconnection portion extending from the land, the resist film having an opening formed therein for exposing the entire land, the opening having a curved edge surrounding a peripheral edge of the land and a linear edge linearly extending along a boundary between the land and the lead interconnection portion, the exposed land having a solder ball as an external terminal thereon.

In the inventive semiconductor device, the opening has the curved edge surrounding the peripheral edge of the land, and the linear edge linearly extending along the boundary between the land and the lead interconnection portion. Since the opening has such a configuration, the generally round land can entirely be exposed from the resist film, and the lead interconnection portion inclusive of a lead portion thereof adjacent to the land can completely be covered with the resist film.

Therefore, the solder ball is bonded onto the land as covering the top and side surfaces of the land, but fused solder is prevented from spreading over the lead interconnection portion.

As a result, a sufficient bonding strength can be ensured between the solder ball and the land, while the displacement of the solder ball can be prevented. Further, the flexibility in designing the lead interconnection portion is not reduced. In addition, the breakage of the lead portion adjacent to the land can be prevented, which may otherwise occur due to concentration of a stress caused by linear expansion of the resist film and the lead interconnection portion.

DESCRIPTION OF THE PREFERRED EMBODIMENTS

Figure 1:
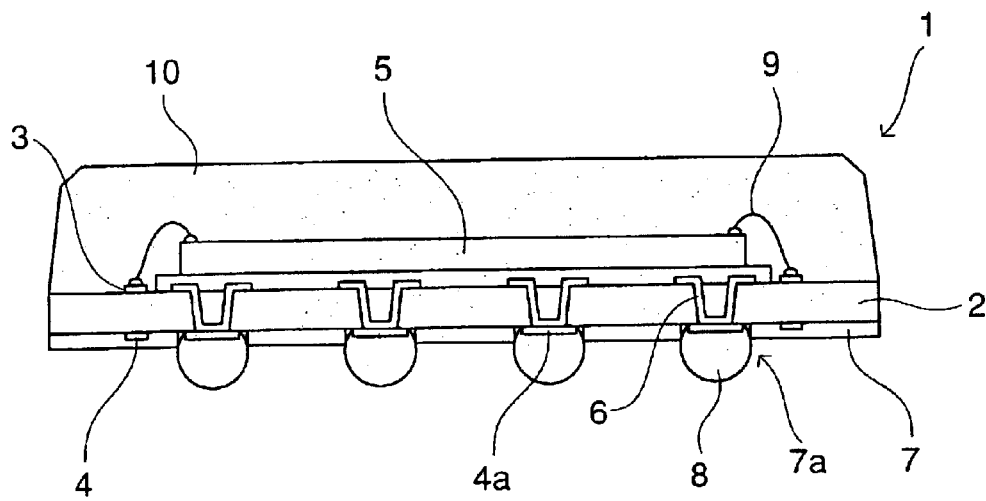
FIG. 1 is a schematic sectional view illustrating the construction of a semiconductor device according to Embodiment 1 of the present invention.

A semiconductor device according to the present invention comprises: a substrate; first and second interconnection patterns respectively provided on upper and lower surfaces of the substrate; a through-hole electrode extending through the substrate for electrically connecting the first and second interconnection patterns; a semiconductor chip provided on the upper surface of the substrate and electrically connected to the first interconnection pattern; and a resist film covering the second interconnection pattern; the second interconnection pattern comprising a generally round land and a lead interconnection portion extending from the land, the resist film having an opening formed therein for exposing the entire land, the opening having a curved edge surrounding a peripheral edge of the land and a linear edge linearly extending along a boundary between the land and the lead interconnection portion, the exposed land having a solder ball as an external terminal thereon.

In the inventive semiconductor device, the substrate is not particularly limited. Usable as the substrate is, for example, a substrate of a glass epoxy resin.

The first and second interconnection patterns are not particularly limited, as long as they are electrically conductive interconnection patterns. For example, the first and second interconnection patterns may each comprise an electrically conductive pattern such as of a copper foil, and an Ni-plated layer and/or an Au-plated layer provided on the conductive pattern.

The through-hole electrode may be such that the interconnection patterns extend into a through-hole formed in the substrate. The through-hole electrode may be, for example, a contact-hole electrode or a via-hole electrode.

The resist film is not particularly limited, as long as it is capable of protecting and isolating the second interconnection pattern from the ambience. For example, a liquid photo solder resist may be used for the formation of the resist film.

In the inventive semiconductor device, the linear edge of the opening is preferably located in contact with the boundary between the land and the lead interconnection portion. With this arrangement, the fused solder is assuredly prevented from spreading over the lead interconnection portion.

In the inventive semiconductor device, the curved edge of the opening may be spaced apart from the peripheral edge of the land by a predetermined distance. In this case, the linear edge of the opening may be spaced apart from the boundary between the land and the lead interconnection portion toward the lead interconnection portion by a distance not greater than one half the predetermined distance.

The predetermined distance between the curved edge of the opening and the peripheral edge of the land may be equivalent to a positional accuracy in the formation of the opening in the resist film.

That is, it is preferred that the linear edge of the opening is located on the boundary between the land and the lead interconnection portion, but there is a possibility that the linear edge is offset from the boundary toward the lead interconnection portion depending on the positional accuracy in the formation of the resist film. Even in such a case, the present invention can provide its intended effect if the distance between the boundary and the linear edge is not greater than one half the positional accuracy in the formation of the resist film.

With reference to the drawings, the present invention will hereinafter be described in detail by way of embodiments thereof. In should be understood that the invention be not limited to these embodiments. In the following embodiments, like components are denoted by like reference numerals.

Embodiment 1

Figure 2:
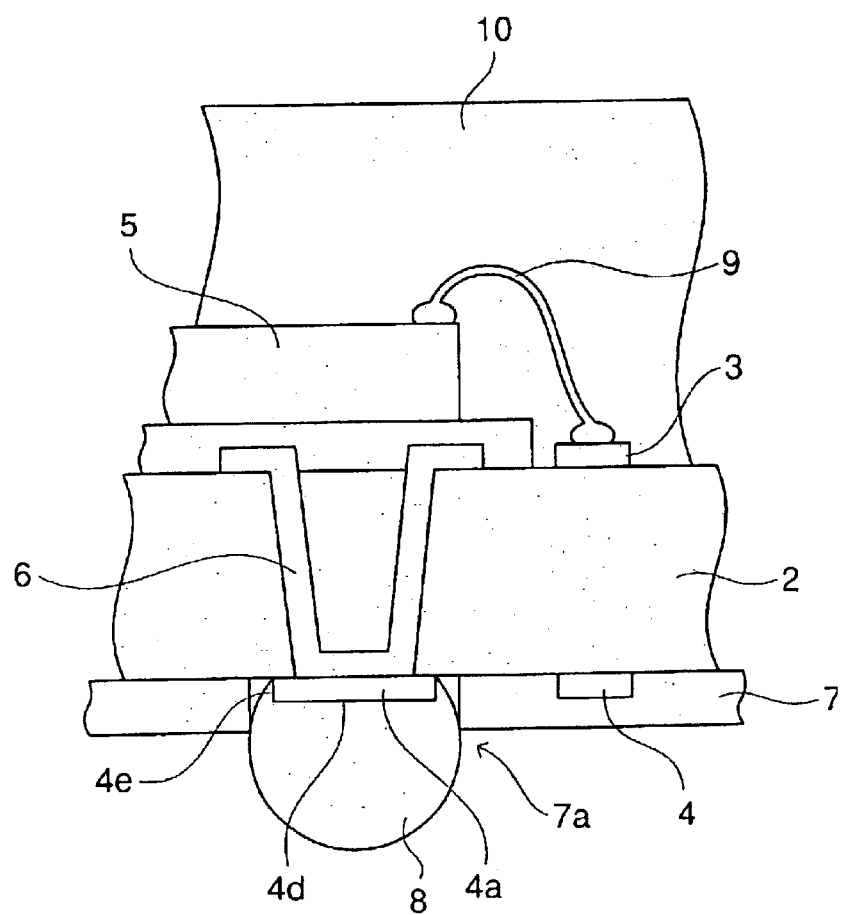
FIG. 2 is an enlarged diagram illustrating major portions of the semiconductor device of FIG. 1.
Figure 3:
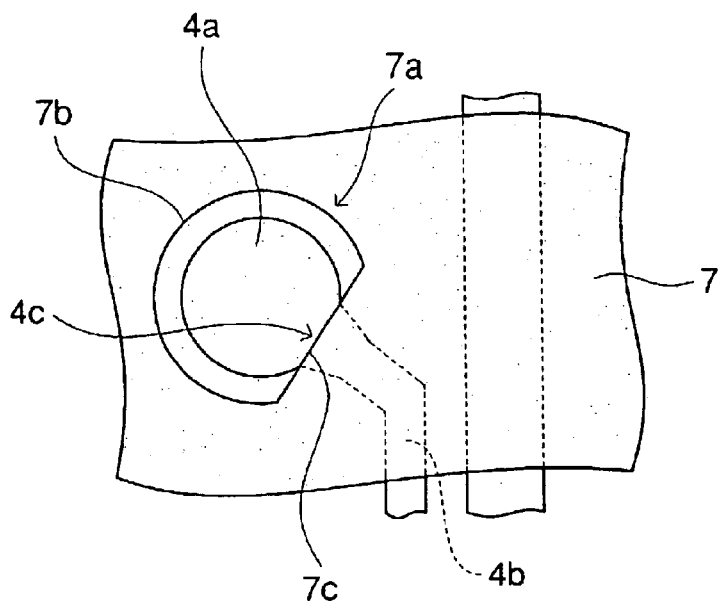
FIG. 3 is a bottom view of the semiconductor device of FIG. 2.

FIG. 1 is a schematic sectional view illustrating the construction of a semiconductor device according to Embodiment 1 of the present invention. FIG. 2 is an enlarged diagram illustrating major portions of the semiconductor device of FIG. 1, and FIG. 3 is a bottom view of the semiconductor device of FIG. 2. In FIG. 3, no solder ball is illustrated for simplicity.

As shown in FIGS. 1 to 3, the semiconductor device 1 according to Embodiment 1 of the present invention includes a substrate 2, first and second interconnection patterns 3 and 4 respectively provided on upper and lower surfaces of the substrate 2, a through-hole electrode (via-hole electrode) 6 extending through the substrate 2 for electrically connecting the first and second interconnection patterns 3 and 4, a semiconductor chip 5 provided on the upper surface of the substrate 2 and electrically connected to the first interconnection pattern 3, and a resist film (solder resist film) 7 covering the second interconnection pattern 4.

As best shown in FIGS. 2 and 3, the second interconnection pattern 4 includes generally round lands 4a, and lead interconnection portions 4b respectively extending from the lands 4a. The resist film 7 has openings 7a for exposing the entire lands 4a. The openings 7a each has a curved edge 7b surrounding a peripheral edge of the land 4a, and a linear edge 7c linearly extending along a boundary 4c between the land 4a and the lead interconnection portion 4b. Solder balls 8 are respectively provided as external terminals on the exposed lands 4a.

As shown in FIG. 1, the semiconductor chip 5 mounted on the substrate 2 has connection terminals (not shown) connected to the first interconnection pattern 3 by bonding wires 9. The semiconductor chip 5 and the bonding wires 9 are sealed in a mold resin 10 such as an epoxy resin.

The first and second interconnection patterns 3, 4 each comprise a copper foil interconnection pattern provided on the substrate 2, and an Ni-plated layer and an Au-plated layer formed on the copper foil interconnection pattern. As shown in FIGS. 1 and 2, the solder balls 8 are each bonded onto the land 4a by applying a predetermined amount of a solder paste (not shown) on the land 4a, placing each solder ball 8 on the land 4a and then reflowing the solder paste in a thermal fusion oven.

As shown in FIG. 2, the solder ball 8 covers the top surface 4d and the side surface 4e of the land 4a thereby to be bonded onto the land 4a with a higher bonding strength.

As shown in FIG. 3, the linear edge 7c of the opening 7a is located on the boundary 4c between the land 4a and the lead interconnection portion 4b, so that the solder fused in the reflow process does not spread over the lead interconnection portion 4b. Therefore, the solder ball 8 has a predetermined spherical shape as shown in FIG. 2 after being bonded onto the land 4a.

Embodiment 2

Figure 4:
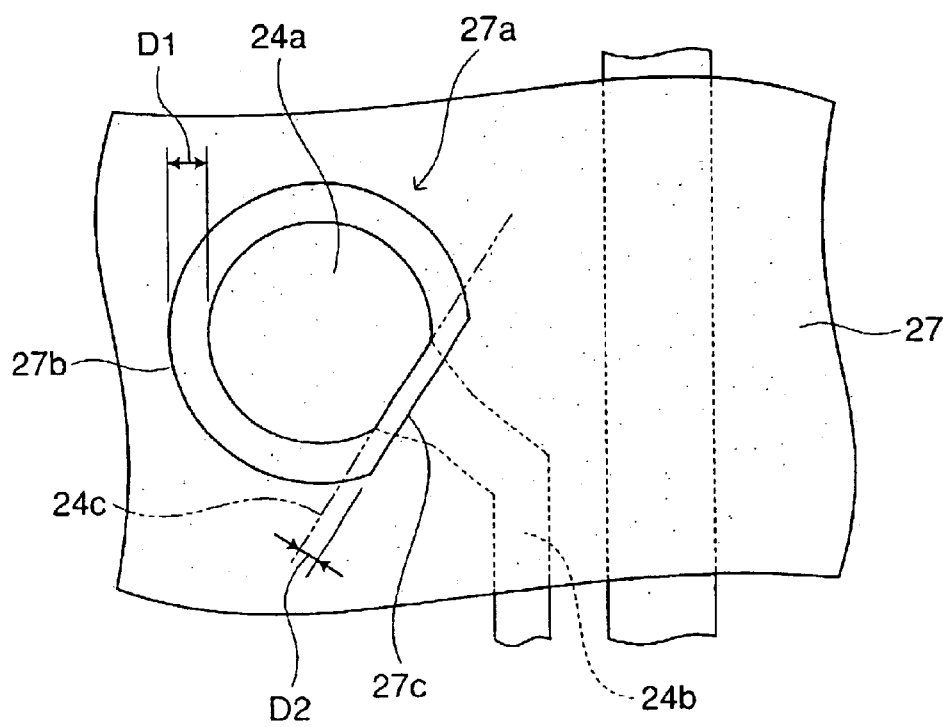
FIG. 4 is a diagram of a semiconductor device according to Embodiment 2 of the present invention, which is equivalent to FIG. 3 showing Embodiment 1.
Figure 5:
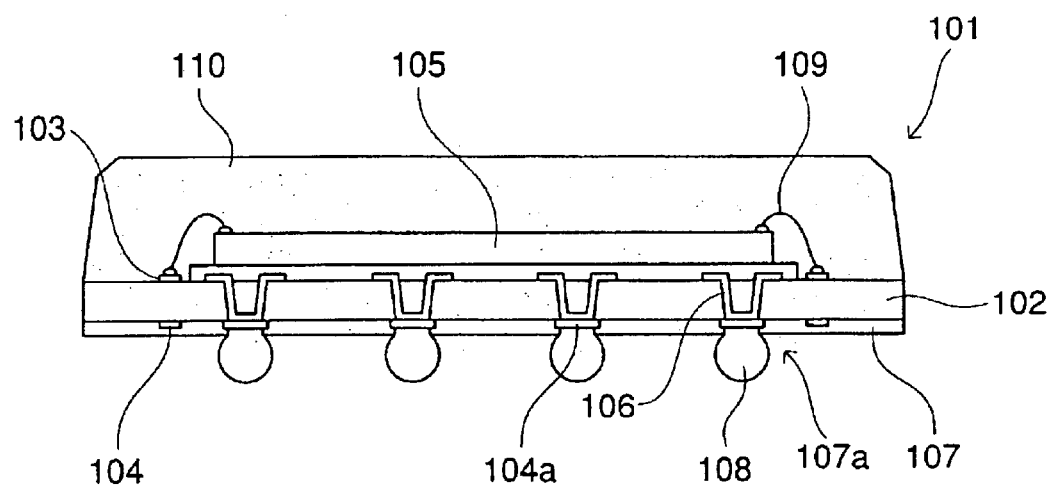
FIG. 5 is a schematic sectional view illustrating an exemplary conventional semiconductor device.
Figure 6:
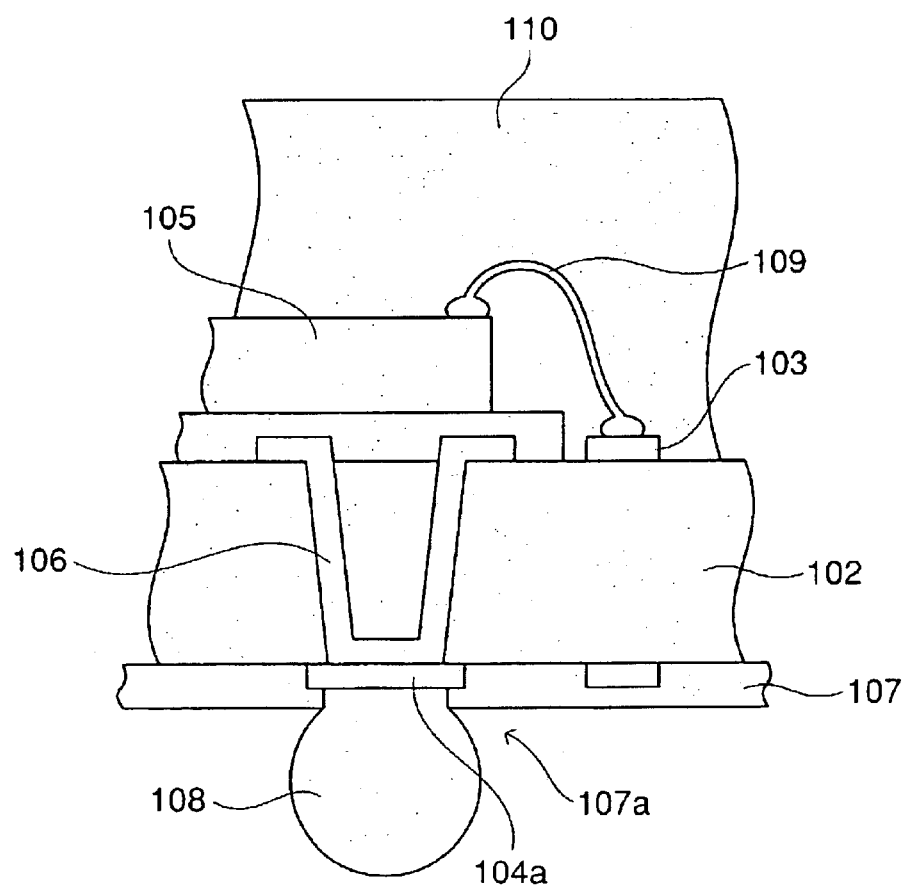
FIG. 6 is an enlarged diagram illustrating major portions of the semiconductor device of FIG. 5.
Figure 7:
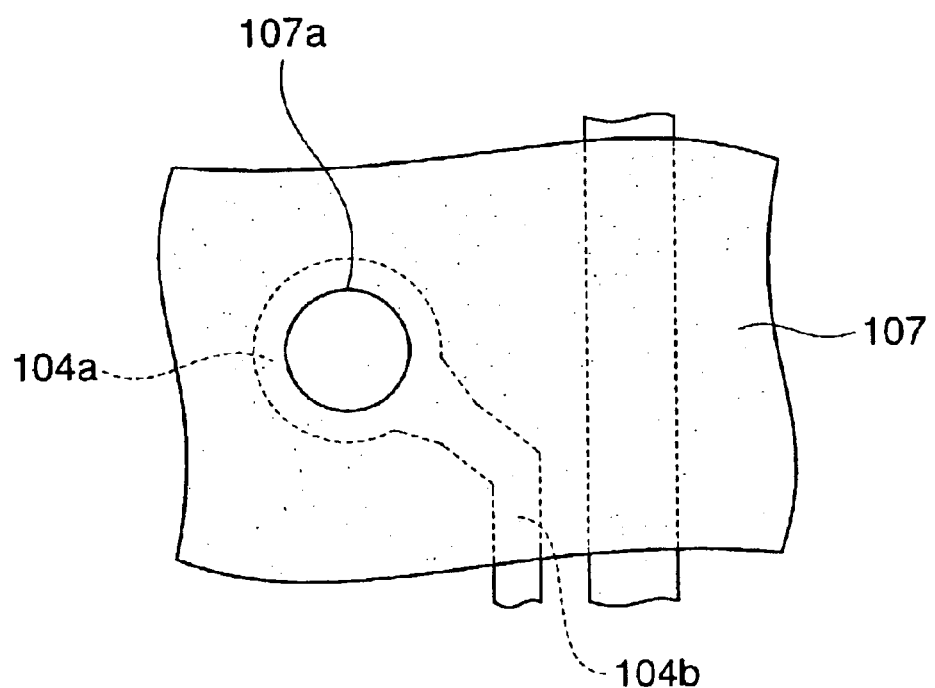
FIG. 7 is a bottom view of the semiconductor device of FIG. 6.

A semiconductor device according to Embodiment 2 of the present invention will be described with reference to FIG. 4. FIG. 4 is a diagram of the semiconductor device according to Embodiment 2 of the present invention, which is equivalent to FIG. 3 showing Embodiment 1.

As shown in FIG. 4, the semiconductor device according to Embodiment 2 has substantially the same construction as the semiconductor device according to Embodiment 1, except that a linear edge 27c of an opening 27a is spaced apart from a boundary 24c between a land 24a and a lead interconnection portion 24b toward the lead interconnection portion 24b by a distance not greater than one half the positional accuracy in the formation of a resist film 27.

As shown in FIG. 4, a curved edge 27b of the opening 27a is spaced apart from a peripheral edge of the land 24a by a distance D1 which is equivalent to the positional accuracy in the formation of the resist film 27, and the linear edge 27c of the opening 27a is spaced apart from the boundary 24c by a distance D2 which is not greater than one half the distance D1. More specifically, the distance D1 is about 50 μm, and the distance D2 is not greater than about 25 μm in Embodiment 2.

The linear edge 27c is ideally located on the boundary 24c between the land 24a and the lead interconnection portion 24b as in Embodiment 1 (see FIG. 3). In Embodiment 2, the effect of the present invention can be provided as in Embodiment 1, if the distance D2 from the boundary 24c is not greater than one half the positional accuracy in the formation of the resist film 27.

According to the present invention, the opening has the curved edge surrounding the peripheral edge of the land, and the linear edge linearly extending along the boundary between the land and the lead interconnection portion. Therefore, the generally round land can entirely be exposed from the resist film, while the lead interconnection portion inclusive of a lead portion adjacent to the land can be covered with the resist film. Thus, the solder ball can be bonded onto the land as covering the top and side surfaces of the land, and the fused solder can be prevented from spreading over the lead interconnection portion.

Further, the breakage of the lead portion adjacent to the land can be prevented which may otherwise occur due to concentration of a stress caused by a difference in linear expansion between the resist film and the lead interconnection portion. As a result, the solder ball can be bonded onto the land with a higher bonding strength without displacement. In addition, the flexibility in designing the lead interconnection portion is not reduced. Thus, the inventive semiconductor device ensures a higher mounting reliability.

What is claimed is:

1. A semiconductor device comprising:

a substrate;

first and second interconnection patterns respectively provided on upper and lower surfaces of the substrate;

a through-hole electrode extending through a through-hole defined in the substrate for electrically connecting the first and second interconnection patterns;

a semiconductor chip provided on the upper surface of the substrate and electrically connected to the first interconnection pattern;

a resist film covering at least part of the second interconnection pattern;

the second interconnection pattern comprising a generally round land located over at least part of the through-hole and a lead interconnection portion extending from the land, the resist film comprising an opening formed therein for exposing the entire land, the opening having a curved edge surrounding a peripheral edge of the land and a linear edge linearly extending along a boundary between the land and the lead interconnection portion, and a solder ball provided as an external terminal on the land, wherein the solder ball is located over at least part of the through-hole.

2. A semiconductor device as set forth in claim 1, wherein the linear edge of the opening is located in contact with the boundary between the land and the lead interconnection portion.

3. A semiconductor device as set forth in claim 1, wherein the curved edge of the opening is spaced apart from the peripheral edge of the land by a predetermined distance.

4. A semiconductor device as set forth in claim 3, wherein the linear edge of the opening is spaced apart from the boundary between the land and the lead interconnection portion toward the lead interconnection portion by a distance not greater than one half the predetermined distance.

5. A semiconductor device as set forth in claim 1, wherein the substrate is composed of a glass epoxy resin.

6. A semiconductor device as set forth in claim 1, wherein the first and second interconnection patterns each comprise an electrically conductive pattern of a copper foil, and at least one of a nickel plated layer and a gold plated layer provided on the electrically conductive pattern.

7. A semiconductor device as set forth in claim 1, wherein the through-hole electrode comprises one of a contact hole electrode and a via hole electrode.

8. A semiconductor device as set forth in claim 1, wherein the resist film is composed of a photo solder resist.

9. A semiconductor device as set forth in claim 1, wherein the semiconductor chip is covered with a mold resin.

10. A semiconductor device as set forth in claim 9, wherein the mold resin is an epoxy resin.

11. A semiconductor device comprising:

a substrate;

first and second interconnection patterns respectively supported by first and second surfaces of the substrate;

at least one through-hole electrode extending through the substrate for allowing electrical communication between the first and second interconnection patterns;

a semiconductor chip supported by the first surface of the substrate and in electrical communication with the first interconnection pattern;

a resist film covering at least part of the second interconnection pattern;

the second interconnection pattern comprising a land located over at least part of the through-hole and a lead interconnection portion extending from the land, the resist film comprising an opening formed therein for exposing the entire land, the opening having a curved edge surrounding a peripheral edge of the land and a linear edge linearly extending along a boundary between the land and the lead interconnection portion, and a solder ball provided as an external terminal on the land, wherein the solder ball is located over at least part of the through-hole, and wherein the solder ball is attached to both a major surface and a side surface of the land.

12. A semiconductor device as set forth in claim 11, wherein the linear edge of the opening is located in contact with the boundary between the land and the lead interconnection portion.

13. A semiconductor device as set forth in claim 11, wherein the curved edge of the opening is spaced apart from the peripheral edge of the land by a predetermined distance.

14. A semiconductor device as set forth in claim 13, wherein the linear edge of the opening is spaced apart from the boundary between the land and the lead interconnection portion toward the lead interconnection portion by a distance not greater than one half the predetermined distance.

* * * * *